PULSE GENERATOR

Filed June 18, 1957 6 Sheets-Sheet 1

DONALD L. BRODERICK
DEXTER C. HARTKE &
MARVIN J. WILLRODT
INVENTORS

BY Flehr & Swain
ATTORNEYS

DONALD L. BRODERICK
DEXTER C. HARTKE &
MARVIN J. WILLRODT
INVENTORS

BY Flehr & Swain
ATTORNEYS

DONALD L. BRODERICK
DEXTER C. HARTKE &
MARVIN J. WILLRODT
INVENTORS

BY [signature]
ATTORNEYS

Sept. 26, 1961 D. L. BRODERICK ET AL 3,002,151

PULSE GENERATOR

Filed June 18, 1957 6 Sheets-Sheet 4

DONALD L. BRODERICK
DEXTER C. HARTKE &
MARVIN J. WILLRODT
INVENTORS

BY [signature]
ATTORNEYS

PULSE GENERATOR

DONALD L. BRODERICK
DEXTER C. HARTKE &
MARVIN J. WILLRODT
INVENTORS

BY [signature]
ATTORNEYS

DONALD L. BRODERICK
DEXTER C. HARTKE &
MARVIN J. WILLRODT
INVENTORS

BY Flehr & Swain
ATTORNEYS

United States Patent Office 3,002,151

Patented Sept. 26, 1961

3,002,151
PULSE GENERATOR

Donald L. Broderick, Menlo Park, Dexter C. Hartke, Saratoga, and Marvin J. Willrodt, Menlo Park, Calif., assignors to Hewlett-Packard Company, Palo Alto, Calif., a corporation of California Filed June 18, 1957, Ser. No. 666,432
5 Claims. (Cl. 328—58)

This invention relates generally to a pulse generator and more particularly to a pulse generator in which the pulse width is digitally controlled.

In many circuits and systems, for example, radar systems, nuclear counting circuits, television systems, video amplifier circuits, filter and band pass circuits, etc., it is desirable to test the action of the systems and circuits under conditions of rapid change. A pulse is admirably suitable for this purpose. In the prior art the pulse width has been continuously controlled by means of an adjustable resistor in a flip-flop circuit or the like. The pulse duration is not digitally adjustable with precise accuracy.

It is an object of the present invention to provide an improved pulse generator.

It is another object of the present invention to provide a pulse generator in which the pulse width is digitally controlled.

It is another object of the present invention to provide a pulse generator which delivers pulses of negative and positive polarity simultaneously and in which the pulse width is digitally controlled.

It is another object of the present invention to provide a pulse generator in which the pulse width is digitally controlled from a crystal controlled frequency source.

It is still another object of the present invention to provide a pulse generator in which the pulse width and repetition rate can be digitally controlled.

It is another object of the present invention to provide a novel pulse forming circuit.

These and other objects of the present invention will become more clearly apparent from the following description and accompanying drawing.

Referring to the drawing.

In terms of broad inclusion, the pulse generator comprises a pulsed crystal oscillator which serves to generate pulsed sinusoidal oscillations. The pulsed sinusoidal oscillations may be externally or internally initiated. An amplitude comparator is connected to receive the pulsed sinusoidal oscillations and to form an output pulse when each cycle of the sine wave reaches a predetermined amplitude. Pre-set counting means receive the pulses and count the same. When predetermined pre-set counts are reached, output pulses are formed. The output pulses are then applied to a pulse forming circuit and serve to control the same whereby the pulse duration is digitally controlled.

Figure 1:
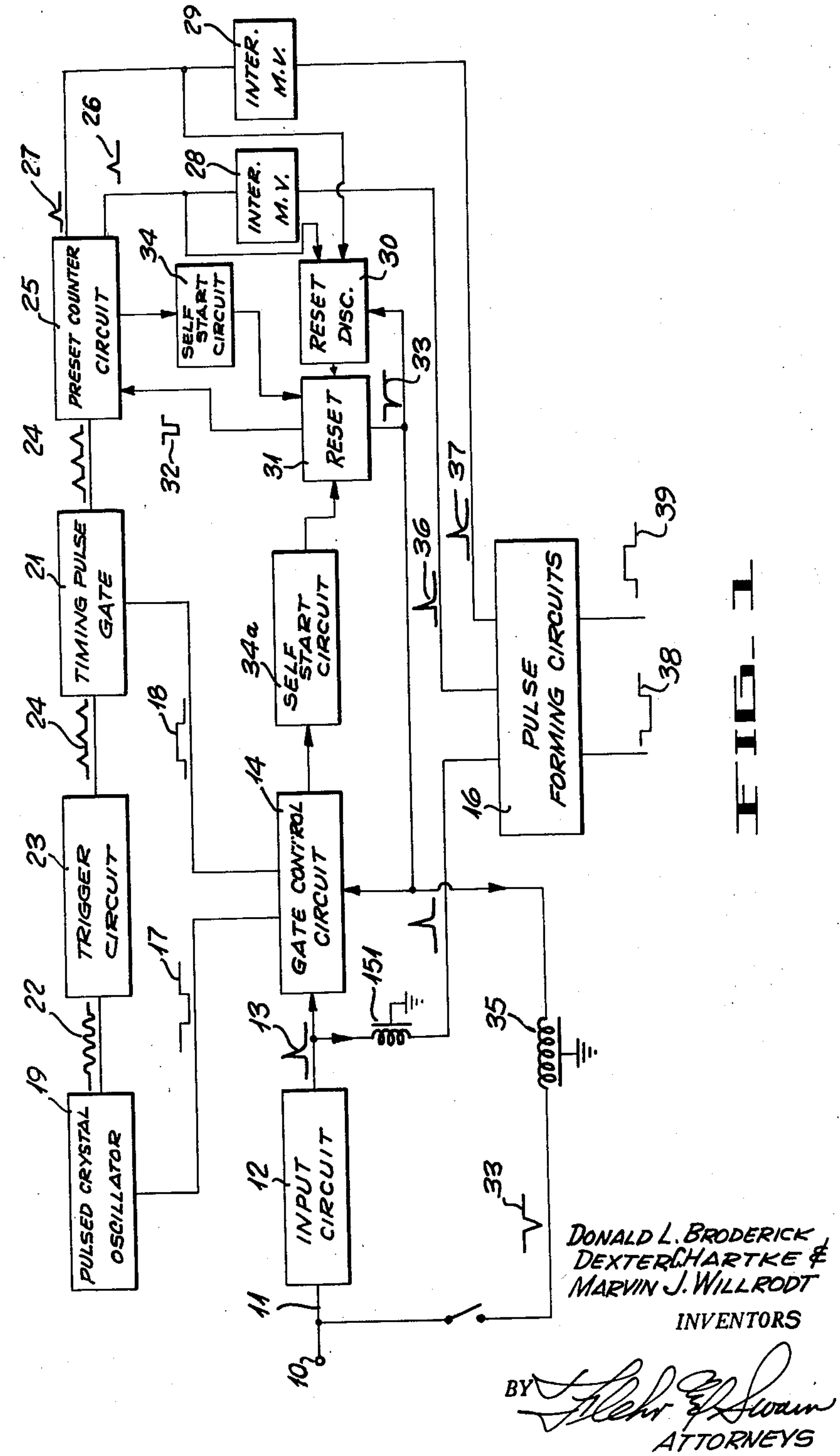
FIGURE 1 is a block diagram of a pulse generator.

Referring now to FIGURE 1, the initiating pulses are applied to the line 11. These pulses may be formed by an external circuit or by the pulse generator, as desired. The pulses serve to control the repetition rate of the pulses formed by the generator. When the initiating pulses are formed by the pulse generator, the repetition rate depends upon the setting of the pre-set counter and is digitally controlled along with the pulse width, as will be presently described.

The pulses are applied from the line 11 to an input circuit 12 which may, for example, be a blocking oscillator which forms a pulse 13 suitable for triggering associated circuits. The pulse 13 is applied to a gate control circuit 14 and a pulse forming circuit 16.

The gate control circuit 14 may comprise a bistable circuit which forms pulses 17 and 18. The pulses are applied to a pulsed crystal oscillator 19 and to a timing pulse gate 21, respectively.

Figure 4:
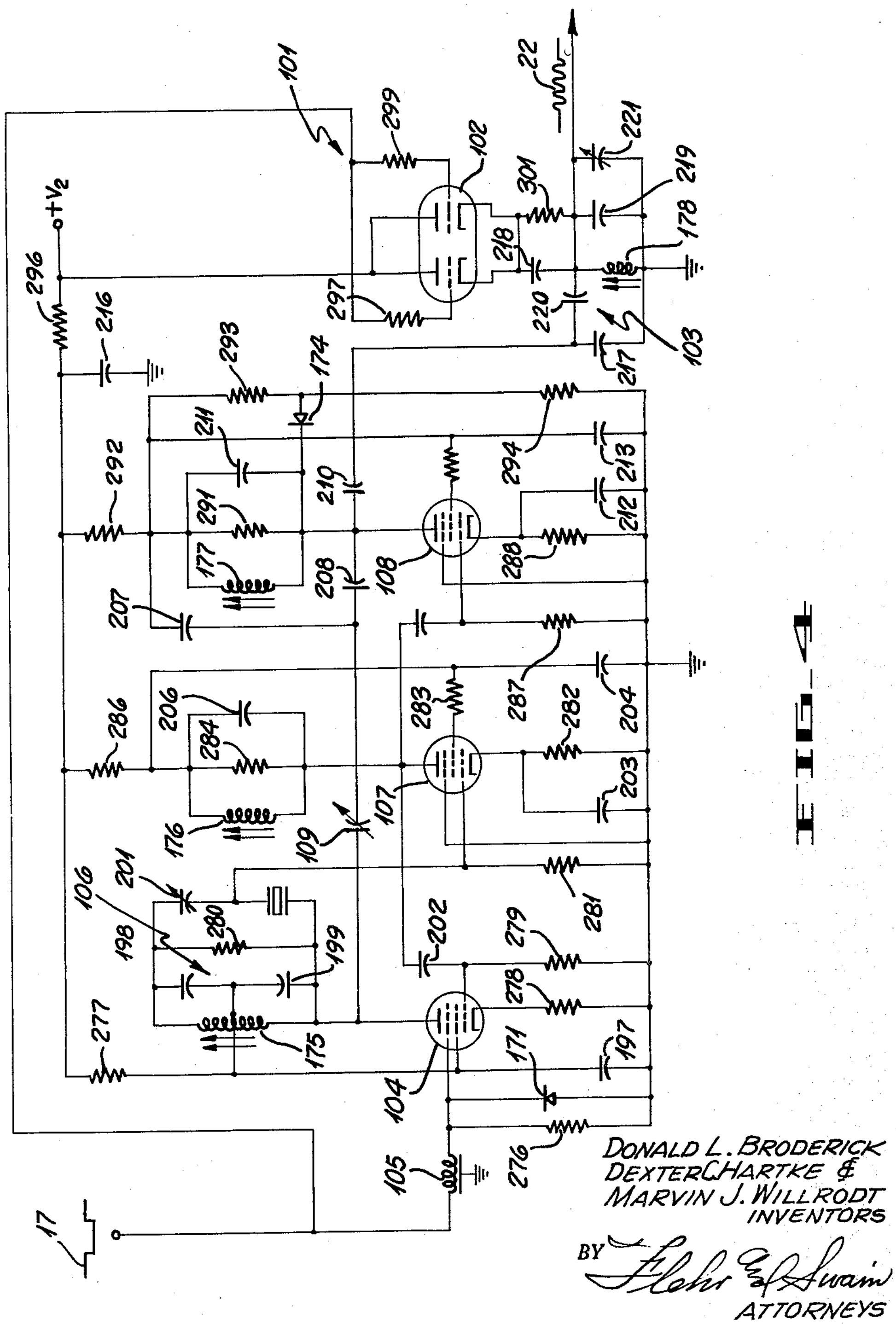
FIGURE 4 is a detailed circuit diagram of the pulsed crystal oscillator of FIGURE 1.

The pulsed crystal oscillator may be one of the types described in vol. 11 (Waveforms), page 145–148 of the Radiation Laboratory Series, McGraw-Hill, 1949. The pulsed crystal oscillator 19 forms a chain of sinusoidal oscillations 22. Preferably, the pulsed crystal oscillator is of the type described in U.S. Patent 2,881,317 entitled, Pulsed Crystal Oscillator and Method issued April 7, 1959 to D. C. Hartke. The circuit is illustrated in FIGURE 4 and will be presently described in detail. The circuit forms a pulsed sinusoidal oscillation which is relatively free of distortion during the beginning of a pulse and in which the amplitude of the pulsed oscillation remains substantially constant for the duration of the same.

Pulsed sinusoidal oscillations 22 are applied to a trigger circuit 23 which serves to form an output pulse train 24 which includes a timing pulse each time a cycle of the sinusoidal wave reaches a predetermined amplitude.

As previously described, at the instant that pulses are applied to the pulsed crystal oscillator a pulse 18 is applied to the timing pulse gate 21. This gate 21 controls the application of the timing pulses 24 to pre-set counter 25. The pulse opens the gate whereby the timing pulses are passed by the gate and applied to and counted by the pre-set counter circuit 25.

The pre-set counter circuit 25 comprises a plurality of electronic counters adapted to be pre-set to a plurality of counts. The counters count the input pulses and form an output pulse each time a pre-set count is reached. By pre-setting the counter, a predetermined time will elapse between the application of an initiating pulse to the crystal oscillator circuit and the formation of output pulses 26 and 27 by the pre-set counters.

The output of the pre-set counters is applied to interpolation multivibrators 28 and 29. The outputs of the multivibrators are applied to the pulse forming circuits 16, to be presently described in detail. The pulse forming circuits 16 serve to form pulses 38 and 39 having a digitally controlled duration, and controllable amplitude for each polarity. The duration is digitally controlled by pre-setting the pre-set counters as will become presently apparent.

The interpolation multivibrators include time delay circuits whereby the output pulses 36, 37 are delayed a predetermined time. Thus, the minimum digital delay increment obtainable by the pre-set counters may be interpolated.

Figure 3:
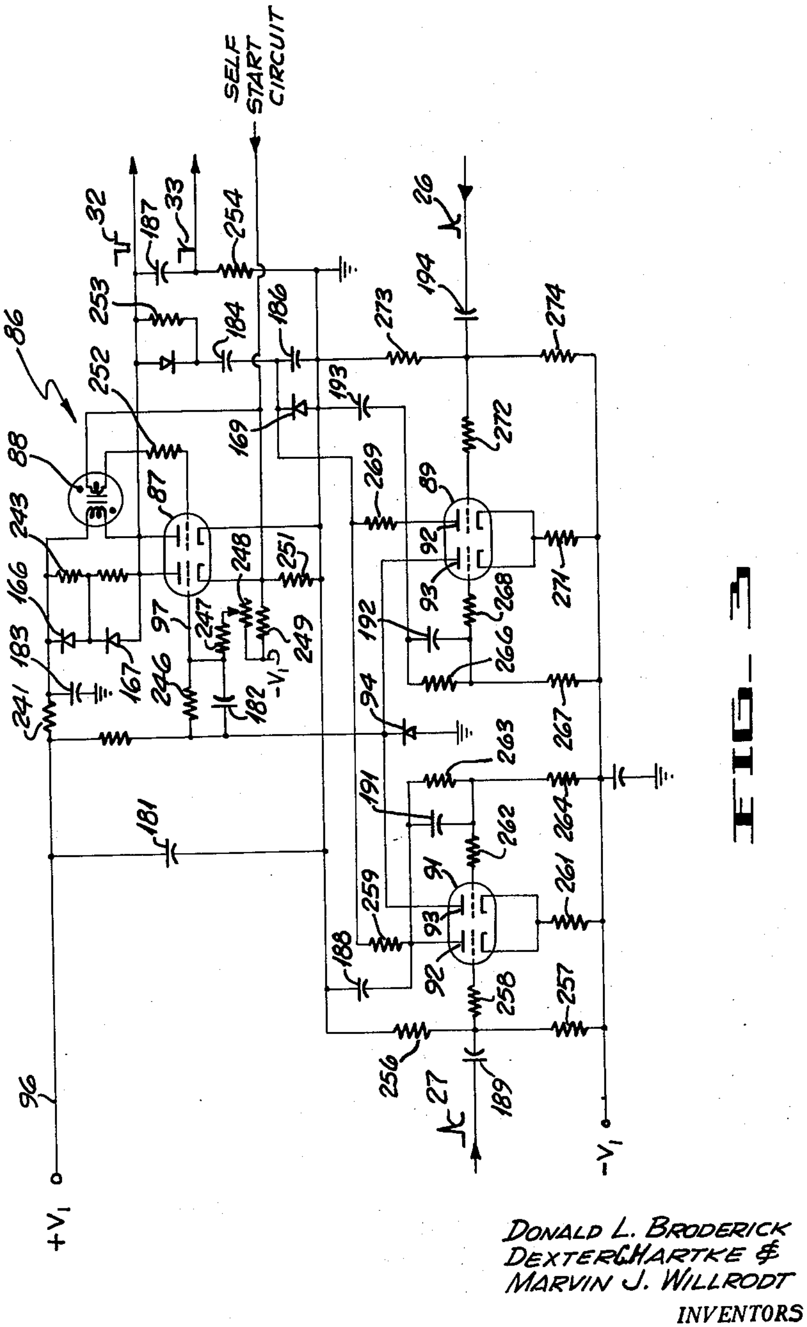
FIGURE 3 is a detailed circuit diagram of the reset circuit of FIGURE 1.

Pulses from the pre-set counter outputs are also applied to a reset discriminator circuit 30 which serves to generate a pulse to operate a reset circuit 31 when the last pre-set pulse is formed by the pre-set counter. The reset circuit provides output pulses 32, 33 which reset the pre-set counters 25, the reset discriminator 30, and the gate control circuit 14. The pulses are also applied to the delay line 35 and thence to the input circuit 12 to re-cycle the pulse generator. The delay line 35 provides sufficient delay for all of the circuits to be reset. Suitable circuits are shown in FIGURE 3 and will be presently described.

When the instrument is first turned on in the re-cycle position, means are provided for initiating the various circuits to begin a counting cycle. No pulses are being formed by the circuit and thus reset pulses are not generated. A self-start circuit 34*a*, which may be a relaxation oscillator, serves to trigger the reset circuit 31 to reset the counting circuits and initiate a cycle of operation. When the circuit is set to be triggered by an external pulse, the preset circuits 25 or the gate circuits 14 may not be in the correct state. The self-start circuit 34 serves to form pulses to trigger these circuits into the correct state. The circuit 34 may also be a relaxation oscillator circuit.

The pulses 36 and 37 from the interpolation multivibrators 28 and 29, respectively, are applied to the pulse forming circuits 16. As previously described, the pulse 13 from the input circuit 12 is also applied to the pulse forming circuits 16. The pulse forming circuits are bistable circuits adapted to be triggered from one stable condition to another, and then back again, by any two of the pulses 13, 36 and 37, as desired. The circuit also includes amplifying means serving to provide an output pulse suitable for driving associated circuits. The pulse forming circuit forms a pair of pulses 38 and 39.

Figure 2:
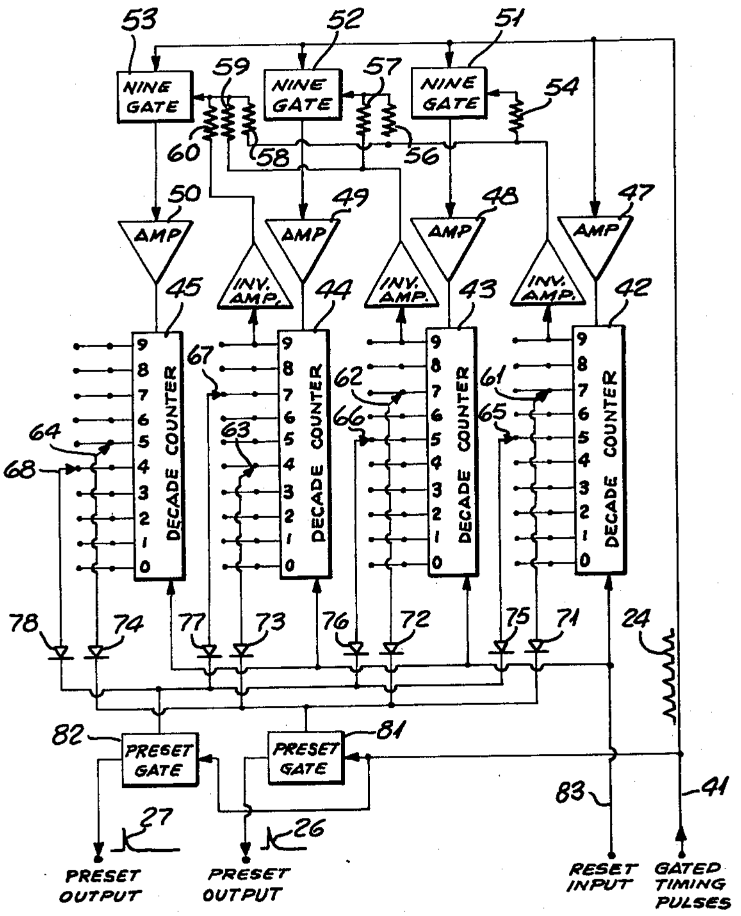
FIGURE 2 is a block diagram of the pre-set counter of FIGURE 1.

Referring now to FIGURE 2, a block diagram of a pre-set counter is shown. The gated timing pulses are applied to the line 41. A plurality of electronic decade counters 42—45 is connected to receive the gated pulses in parallel. The counters 42—45 may be of the beam switching type tube which includes targets (plates), spades (beam forming and locking elements) and switching grids which act to switch the beam from one target to another in response to an input pulse. Counter tubes of this type are well known.

The timing pulses 24 coming through the timing pulse gate 21 are counted by the counters to establish digital time delays. When the counters reach a count corresponding to the pre-set count, a voltage is formed which opens pre-set gates 81 and 82 to pass the output pulses 26 or 27 directly from the timing pulse source.

Unlike conventional decade counter systems which are used in cascade operation, the counters are connected for parallel feed in order to reduce the total circuit operating time. The timing pulses are fed along the line 41 simultaneously to the input amplifiers 47—50 of the four decade counters 42—45. The units counter 42 receives and counts each timing pulse. The tens, hundreds and thousands counters 43—45, respectively, are each preceded by a gate which permits them to count only every tenth, hundredth and thousandth timing pulse, respectively. The tens counter 43 is preceded by a nine gate 51 which opens only when the units counter is on the digit "9" just prior to the tenth timing pulse. The tenth timing pulse from the timing pulse gate triggers both the units and tens counters simultaneously; the units counter 42 goes from 9 to 0 while the tens counter 43 advances one digit. The nine gate is then closed as the unit counter is no longer on "9."

The hundreds counter 44 is preceded by a nine gate 52 which opens only when both the units and tens counters are on their "9" digit simultaneously. The hundredth pulse from the timing pulse gate then triggers the units, tens and hundreds counters simultaneously; units and tens counters 42 and 43 go from 9 to 0, and the hundreds counter advances one digit. The nine gate is then closed as the units and tens counters are both switched off the numeral "9." Similarly, the thousands counter 45 is preceded by a nine gate 53 which opens only when the units, tens and hundreds counters are on "9" simultaneously. The thousandth driving pulse from the timing pulse gate then triggers all four counters simultaneously; the units, tens and hundreds counters go from 9 to 0 while the thousands counter advances one digit. The nine gate is then closed as the units, tens and hundreds counters are switched off of the numeral "9."

The gate opening voltage for the tens counter is obtained from the nine target of the units counter and is applied through the resistor 54. The gate operating voltage for the hundreds counter is obtained from the nine targets of both the units and tens counters through the resistive matrix comprising resistors 56 and 57. The resistors are so chosen that the voltage cannot open the nine gate until both the units and tens are on the count of nine. Likewise, the gate opening voltage for the thousands counter is obtained from the nine targets of all previous counters through the resistive matrix comprising resistors 58, 59 and 60. The matrix cannot open the gate 53 until all previous counters are on the count of nine simultaneously.

Using this drive system, the time required for one decade to operate, as when going from a count of 4998 to 4999, when the unit decade goes only from 8 to 9 is the same as when all four decades are operated, as when going from 4999 to 5000. In this case, the first three decades go from 9 to 0 and the fourth goes from 4 to 5, all nine gates are open at the count of 4999 so that the next driving pulse drives all decades simultaneously.

To obtain the desired time delay, a ten position switch is associated with each of the counters. The switch may be set to select a particular beam switching tube target (plate). Thus, the switches 61—68 are shown with their contacts connected to the various plates. The switch arms feed through the diodes 71—78 to the pre-set gates 81 and 82. The switches 61—64 are connected through the diodes 71—74 to the pre-set gate 81 while the switches 65—68 are connected through the diodes 75—78 to the pre-set gate 82. When the counters have counted to the count pre-set on the four associated switches, the voltage on the respective gate is changed to open the gate. With the gate open, the next timing pulse along the line 41 passes through the respective pre-set gate. Thus, the pulse 26 is passed by the pre-set gate 81 (as set, it will pass the next timing pulse after the count reaches 5477) and the pulse 27 is passed by the gate 82 (as set, the pulse following 4755 is passed).

Thus, it is seen that the pre-set gate passes the timing pulse following the one which caused it to open. It would appear that the delay would be one timing pulse interval greater than that indicated by the dial setting. However, this is compensated for by designing the apparatus so that a pulse is formed at zero time as well as each microsecond thereafter.

The counter circuit continues to count one microsecond timing pulses until a reset pulse is formed, following the longest delay as will be presently described. The reset pulse then closes the timing pulse gate and resets the counters along line 83. The pulses 26 and 27 are applied to the interpolation multivibrators which can introduce a delay corresponding to the period between timing pulses. The interpolation delay multivibrators are one shot multivibrators which have adjustable resistors to provide the appropriate time delay.

The reset discriminator 30 and reset circuit 31 are illustrated in detail in FIGURE 3. The negative output pulses 32 and 33 are formed by the reset circuit which includes a blocking oscillator designated generally by the reference numeral 86. The blocking oscillator 86 includes a dual triode 87 and a feedback transformer 88 connected in a conventional manner to form a blocking oscillator. The circuit is triggered by the reset discriminator circuit which includes the tubes 89 and 91, by the self-start circuit 34 when the circuit is set to be triggered by external pulses, or by self-start circuit 34*a* when the delay generator is set to provide an internal digital rate.

During the delay period, the tubes 89 and 91 each have their plate 92 cut off and plate 93 conducting and clamped to ground by a diode 94. One of the pre-set gates is connected to the tube 89 and the other to the tube 91 and serve to trigger the respective tube when output pulses 26 and 27 are formed. Assuming, for example, that the pulse 26 occurs first, the tube 89 will be triggered so that the plate 92 conducts and plate 93 is cut off. The plate 93 of tube 89 remains at the ground potential however, since it is connected to ground through the diode 94 and held there by plate 93 of tube 91 which is still conducting. When the pulse 27 occurs, the tube 91 is triggered whereby the plate 92 becomes conductive. Both discriminators now have their plates 93 cut off and the voltage at the top of the crystal 94 begins to rise towards the plate voltage +V applied to the line 96. The reset blocking oscillator 86 is triggered since its grid 97 is pulled above the cut off voltage as the voltage across the diode 94 rises.

The blocking oscillator forms negative pulses: pulse 33 which is applied to the gate control circuit, to the discriminator circuit to reset the tubes 89 and 91, and to the input circuit to re-cycle the generator; and the pulse 32 which resets the decade counters.

A preferred pulsed oscillator is illustrated in FIGURE 4. The pulsed oscillator illustrated serves to derive extremely accurate timing pulses with respect to a completely random reference pulse. This circuit is capable of generating a train of sinusoidal oscillations that is synchronized with a random start pulse applied to the line 11. This pulsed crystal oscillator provides a discreet number of pulses which are counted in the digital circuitry, previously described, to obtain the desired delay period whereupon the crystal oscillator is stopped.

The circuit includes a ringer designated generally by the reference numeral 101 and comprising the tube 102 and the associated LC circuit 103. The LC resonant circuit behaves in a predictable and dependable manner when excited by a transient step voltage. The step voltage cuts off the cathode of the tube 102 thereby exciting the LC circuit. This circuit is adjusted to be resonant at the frequency of the crystal oscillator. It forms a damped train of oscillations. The first few cycles establish the phase relation with respect to the random start pulse.

The step voltage which excites the ringer circuit is applied to the gate 104 through a delay line 105. The delay is such that the pulsed crystal oscillations and the damped oscillations of the ringer circuit have the proper phase relationship.

The oscillator itself consists of a bridged type frequency determining circuit 106, followed by two tuned amplifier stages 107 and 108. The second amplifier, from which a feedback signal is obtained, limits the amplitude of the oscillations. To stop the oscillator, negative feedback is taken from the plate of the first amplifier 107 and applied through the gate 104 to the crystal oscillator bridge. At the ringer the amplified crystal output combines with the ringer circuit output to form a pulsed sinusoidal oscillation which has relatively constant amplitude and is suitable for timing purposes. The positive feedback from the limiting amplifier is so selected that the amplitudes of oscillation remain constant after the first few cycles. This is determined by adjusting the value of the capacitor 109.

Figure 5:
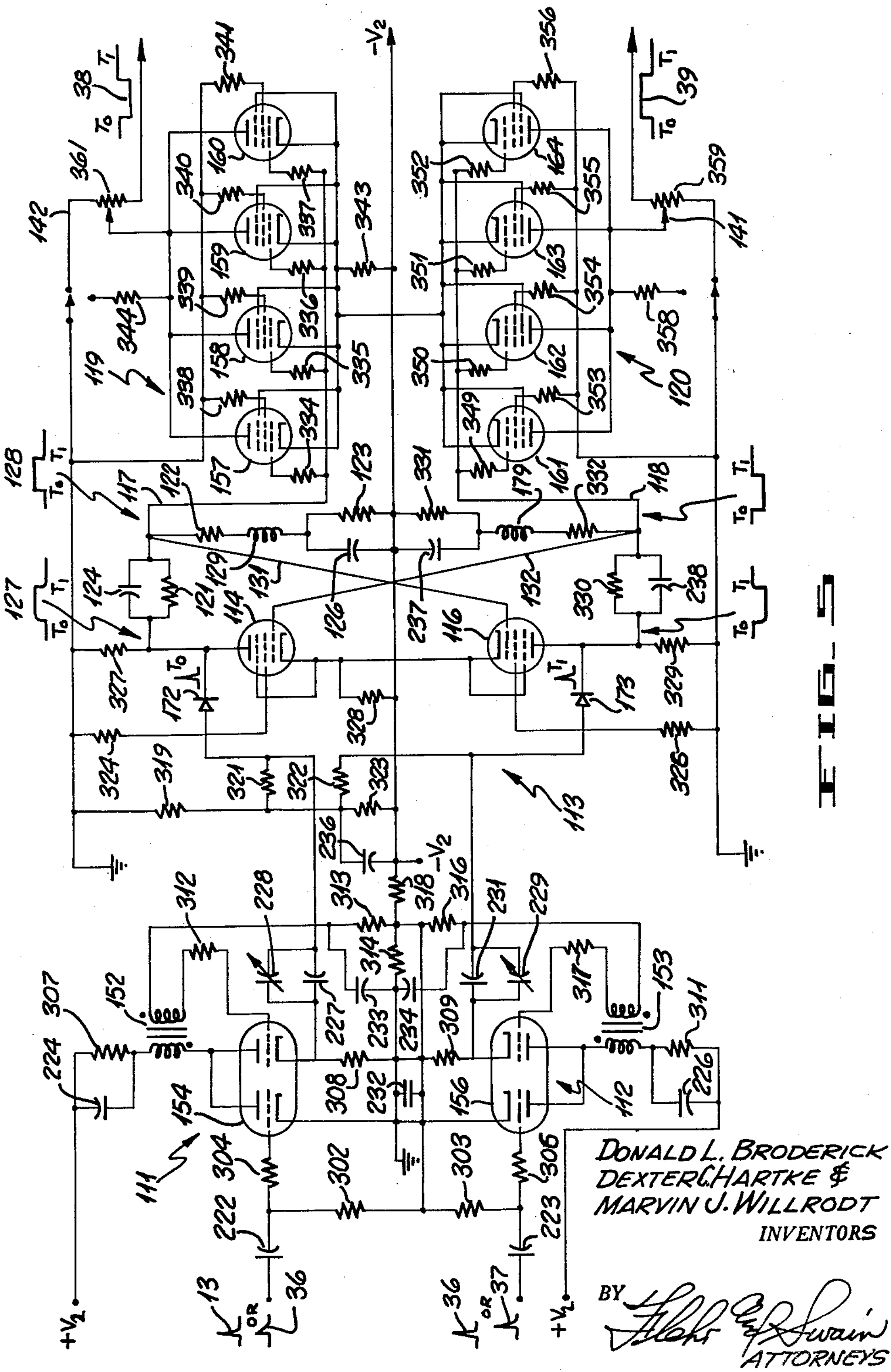
FIGURE 5 is a detailed circuit diagram of the pulse forming circuit of FIGURE 1.

The waves 13, 36 and 37, previously described, are applied to the pulse forming circuit which is illustrated in detail in FIGURE 5. The circuit comprises a pair of plate coupled blocking oscillators designated generally by the reference numerals 111 and 112. The blocking oscillators receive a pair of the pulses 13, 36 and 37 (a selector switch selects 13 and 36, or 36 and 37, or 13 and 37) and serve to form triggering pulses for the bistable circuit designated generally by the reference numeral 113. The blocking oscillators 111 and 112 may be of conventional design.

The bistable circuit 113 comprises a pair of cathode coupled tubes 114 and 116. The cathodes are connected to a negative volt supply $-V_2$ with the plates of the tubes being coupled to ground, whereby the circuit is operated below ground potential. The bistable circuit is D.C. coupled by the lines 117 and 118 to the output amplifiers 119 and 120.

The circuit 113 employs an interstage network in which the load impedance and the plate-to-grid attenuation varies with frequency. The network is so arranged that the voltage delivered to the grid and to the external circuit associated therewith is constant over the operating frequency range. This is achieved by appreciably reducing the plate-to-grid attenuation at very high frequencies whereby nearly full plate voltage is coupled to the grids and load thereby minimizing tube current and tube dissipation for a given plate load impedance. In the prior art the plate load impedance and plate-to-grid attenuation were maintained constant over the operating frequency range. As a result, fast response dictated a low load impedance, and thus high tube currents.

In the circuit of the invention the plate-to-grid attenuation is made to decrease with frequency with an arbitrary time constant. The frequency dependent attenuation is compensated for by selecting a load impedance which decreases with frequency with substantially the same time constant.

Referring to the drawings, the circuits are so arranged and designed that the coupling networks connected between the plate of each of the tubes and the negative supply source have equal time constants on the two sides of lines 117 and 118. The resistive capacitive coupling network is so chosen that it behaves in the manner referred to hereinabove.

Referring to one of the coupling circuits, that of tube 114, the D.C. and low frequency coupling is through the resistors 121, 122 and 123. The D.C. and low frequency voltage at the plate of one tube is attenuated at the grid of the other tube. The plate voltage is, therefore, greater than the grid voltage by this amount of attenuation. For fast response, it is desirable to have a low load impedance, as previously described. The capacitors 124 and 126 are connected in shunt with the resistors 121, 123. At relatively high frequencies, resistors 121, 123 are bypassed and the plate of the tube is loaded by the resistor 122. At the higher frequencies the voltage at the grid is substantially the same as the voltage at the plate. A peaking inductance 129 may be connected in series with the resistor 122.

A typical waveform at the plate of the tube 114 is shown at 127. A typical waveform at the input to the amplifier 119 is shown at 128. The tubes 114, 116 have the grids cross-coupled to the output lines 117, 118 by the lines 131, 132.

Operation of the circuit is as followers: a pulse $T_0$ from the blocking oscillator is applied to the plate of the tube 114. This pulse appears across the voltage coupling network and is applied to the control grid of the tube 116 thereby triggering tube 116 to become conducting and lowering its plate voltage. The tube 114 is cut off by the negative impulse applied to its grid from the output of the tube 116. The circuit is triggered back by the pulse $T_1$ from the other blocking oscillator. The pulses which operate the blocking oscillator 111 and 112 are a pair of the three pulses 13, 36 and 37.

The output of the flip-flop circuit is applied to the amplifiers 119, 120 which include a plurality of tubes connected in parallel to thereby supply output pulses 38, 39, respectively. As previously described, the pulses have adjustable amplitude and are capable of delivering large power to associated apparatus.

Figure 6:
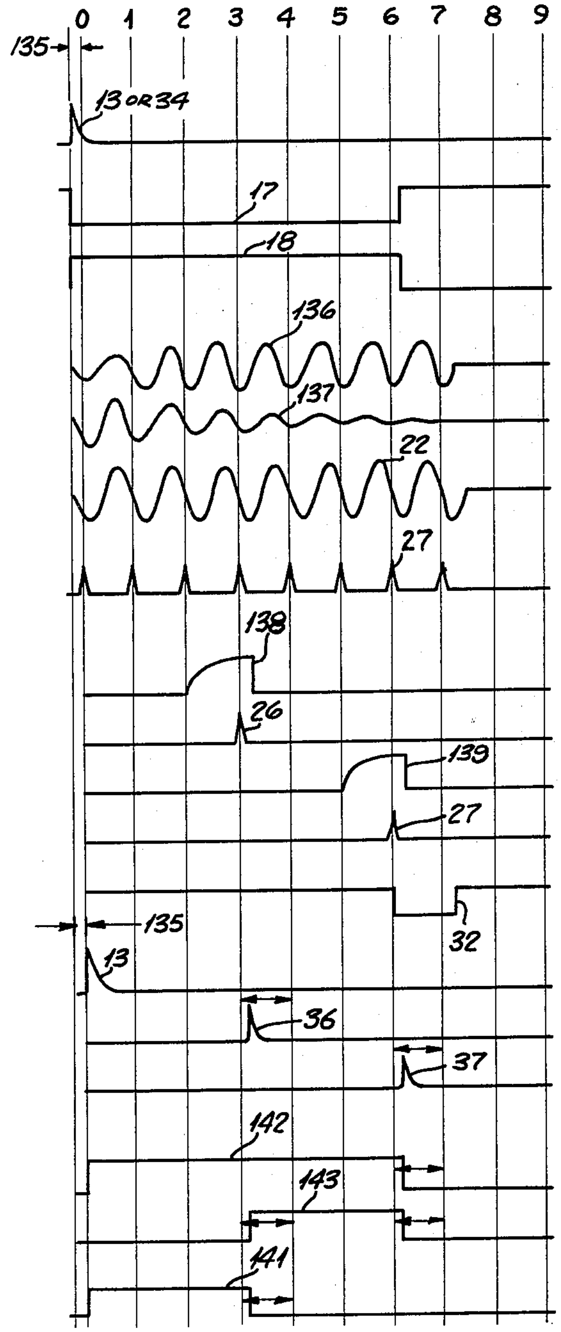
FIGURE 6 shows the waveforms formed by various circuits of the pulse generator.

Operation of the overall circuit may be more clearly understood with reference to FIGURE 6. The pulse input which may be from an external source 10 or the pulse 33 is applied to the input circuit 12. The pulse 13 applied to the pulse forming circuit is delayed a period of time 135 corresponding to the delay in forming the first timing pulse. The first timing pulse appears at zero time of the timing interval to add a count, as previously described, to compensate for the action of the gates 81 and 82 of the counting circuit 25. The pulse 13 is applied to the gate control circuit 14 which forms pulses 17 and 18. As previously described, the pulse 17 is applied to the pulsed crystal oscillator through a delay line and to the ringer circuit. The amplified crystal output 136 and the ringer output 137 are combined to form the pulsed sinusoidal oscillations shown at 22. Timing pulses are formed as shown at 24 slightly after the start, time zero, by the trigger circuit 23. These pulses are passed by the timing pulse gate 21 which has been opened by the pulse 18 to the pre-set counters 25. The counters count the pulses 24 until the value pre-set by the switches 61—64 and 65—68 has been reached. When the count set by the first of the switches has been reached, the associated pre-set gates 81 or 82 have a voltage pulse 138 or 139, respectively, applied thereto. When the gate 81 is opened, it passes the next timing pulse 26 to the associated interpolation multivibrator 28 which serves to form a pulse 36. The apparent delay of one count in the passing of the pulse is compensated for by the fact that at the time zero a timing pulse is formed. Similarly, when the second count is reached, a voltage pulse 139 is formed which opens the gate. The next timing pulse 27 is passed to the interpolation multivibrator 29 which forms the output pulse 37.

Simultaneously with the formation of the last pulse, the discriminator circuit, previously described, serves to trigger the blocking oscillator 86 whereby reset pulses 32 and 33 are formed. These pulses serve to reset the various circuits, as previously described. The timing pulses 36 and 37 formed by the interpolation multivibrators are applied to the pulse forming circuit.

The pulses 13 or 36 may be employed to trigger the blocking oscillator 111 whereby the digital pulse will commence either a fixed delay after application of the initiating pulse (pulse 13) or the fixed delay plus an adjustable digital delay after application of the initiating pulse (pulse 36). The blocking oscillator 112 is triggered by the pulse 36 or 37 which may be digitally controlled with respect to either pulse 13 or 36. Thus, the pulse duration (pulses 38 and 39) is digitally controlled with an accuracy which is dependent upon the crystal oscillator circuit. The pulse 13 may start the output pulse and pulse 36 stop the output pulse 141, or 13 may start the output pulse and 37 stop the output pulse 142, or 36 start the output pulse and 37 stop the output pulse 143.

The pulses can be generated at a precise rate by feeding the reset pulse 33 back to the input through a delay line 35. The delay line allows time for all circuits to be reset. The delay limits the maximum repetition rate of the pulses. The repetition rate is digitally controlled. Assuming use of pulses 36 and 37 for digitally controlling the pulse duration, the repetition rate is increased by decreasing the delay between pulse 13 and pulse 37, and decreased by increasing the delay. Thus, it is seen that the asymmetry and repetition rate can be digitally controlled.

Apparatus was constructed as described and shown in the figure. The circuit components were as follows:

Delay Lines:

| | | |
|---|---|---|
| 35 | microsecond delay | 10 |
| 105 | do | .5 |
| 151 | do | .05 |

Transformers:

| | | |
|---|---|---|
| 88—Toroid type H ferramic | turns | 20–40 |
| 152—Toroid type H ferramic | do | 10–20 |
| 153—Toroid type H ferramic | do | 10–20 |

Tubes were known by manufacturer's specs. as:

| | | | |
|---|---|---|---|
| 87 | 5637 | 108 | 6AH6 |
| 89 | 12AT7 | 114 | 6197 |
| 91 | 12AT7 | 115 | 6197 |
| 102 | 5965 | 154 | 5687 |
| 104 | 6AS6/5725 | 156 | 5687 |
| 107 | 6AH6 | 157–164 | 6197 |

Diodes were known by manufacturer's specs. as follows:

| | | | |
|---|---|---|---|
| 71–78 | 212–G11A | 169 | 212–G11A |
| 94 | 212–G11A | 171 | 212–G11A |
| 166 | 1N55 | 172 | 212–G11A |
| 167 | 1N55 | 173 | 212–G11A |
| 168 | 1N55 | 174 | 212–G11A |

Inductors:

| | | |
|---|---|---|
| 129 | h | 1.2 |
| 175 | h | 120 |
| 176 | h | 600 |
| 177 | h | 100 |
| 178 | h | 200 |
| 179 | h | 1.2 |

Capacitors:

| | | | | | |
|---|---|---|---|---|---|
| 109 | μμf | 1.5–7 | 210 | μμf | 47 |
| 124 | μμf | 200 | 211 | μμf | 240 |
| 126 | μμf | 1000 | 212 | μf | .02 |
| 181 | μf | .02 | 213 | μf | .1 |
| 182 | μμf | 47 | 214 | μμf | 47 |
| 183 | μf | .051 | 216 | μμf | 10 |
| 184 | μμf | 390 | 217 | μμf | 470 |
| 186 | μμf | 390 | 218 | μμf | 390 |
| 187 | μμf | 5 | 219 | μμf | 47 |
| 189 | μμf | 390 | 220 | μμf | 75 |
| 191 | μμf | 47 | 221 | μμf | 7–45 |
| 192 | μμf | 47 | 222 | μf | .005 |
| 193 | μμf | 22 | 223 | μf | .005 |
| 194 | μμf | 390 | 224 | μf | .01 |
| 196 | μf | .02 | 226 | μf | .01 |
| 197 | μf | .1 | 227 | μμf | 56 |
| 198 | μμf | 200 | 228 | μμf | 8–50 |
| 199 | μμf | 200 | 229 | μμf | 8–50 |
| 201 | μμf | 1.5–7 | 231 | μμf | 56 |
| 202 | μμf | 390 | 232 | μf | .01 |
| 203 | μf | .02 | 233 | μμf | 47 |
| 204 | μf | .1 | 234 | μμf | 47 |
| 206 | μμf | 62 | 236 | μf | .01 |
| 207 | μμf | 62 | 237 | μμf | 1000 |
| 208 | μμf | 5 | 238 | μμf | 200 |
| 209 | μμf | 390 | 239 | μf | .03 |

Resistors:

| | | | | | |
|---|---|---|---|---|---|
| 54 | ohms | 10K | 286 | ohm | 4700 |
| 56 | do | 22K | 287 | do | 100K |
| 57 | do | 22K | 288 | do | 180 |
| 58 | do | 33K | 289 | do | 100 |
| 59 | do | 33K | 290 | do | 100 |
| 60 | do | 33K | 291 | do | 4700 |
| 121 | do | 479K | 292 | do | 2200 |
| 122 | do | 230 | 293 | do | 100 |
| 123 | do | 95.5K | 294 | do | 15K |
| 241 | do | 100 | 296 | do | 470 |
| 242 | do | 82K | 297 | do | 47 |
| 243 | do | 270 | 299 | do | 47 |
| 244 | do | 270 | 301 | do | 470 |
| 246 | do | 560K | 302 | do | 4700 |
| 247 | megohms | 1.8 | 303 | do | 4700 |
| 248 | ohms | 0–500K | 304 | do | 47 |
| 249 | do | 123K | 306 | do | 47 |
| 251 | do | 18.37K | 307 | do | 100 |
| 252 | do | 150 | 308 | do | 100 |
| 253 | do | 5600 | 309 | do | 100 |
| 254 | do | 8200 | 311 | do | 100 |
| 256 | do | 180K | 312 | do | 47 |
| 257 | do | 137K | 313 | do | 4700 |
| 258 | do | 180 | 314 | do | 10K |
| 259 | do | 12K | 316 | do | 4700 |
| 261 | do | 22K | 317 | do | 47 |
| 262 | do | 180 | 318 | do | 123K |
| 263 | do | 137K | 319 | do | 56K |
| 264 | do | 137K | 321 | do | 22K |
| 266 | do | 137K | 322 | do | 22K |
| 267 | do | 137K | 323 | do | 150K |
| 268 | do | 180 | 324 | do | 47 |
| 269 | do | 12K | 326 | do | 47 |

| | | | | | |
|---|---|---|---|---|---|
| **271** | ---do---- | 22K | **327** | ---do---- | 1000 |
| **272** | ---do---- | 180 | **328** | ---do---- | 470 |
| **273** | ---do---- | 180K | **329** | ---do---- | 1000 |
| **274** | ---do---- | 137K | **330** | ---do---- | 479K |
| **276** | ---do---- | 3300 | **331** | ---do---- | 95.5K |
| **277** | ---do---- | 4700 | **332** | ---do---- | 230 |
| **278** | ---do---- | 150 | **334–341** | do---- | 47 |
| **279** | ---do---- | 100K | **343** | ---do---- | 250 |
| **280** | ---do---- | 10K | **344** | ---do---- | 500 |
| **281** | ---do---- | 100K | **349–356** | do---- | 47 |
| **282** | ---do---- | 180 | **358** | ---do---- | 500 |
| **283** | ---do---- | 100 | **359** | ---do---- | 90 |
| **284** | ---do---- | 4700 | **361** | ---do---- | 90 |

The voltages applied were as follows:

| | Volts |
|---|---|
| $+V_1$ | 285 |
| $+V_2$ | 180 |
| $-V_1$ | 195 |
| $-V_2$ | 200 |

The pulsed crystal oscillator circuit gave sinusoidal bursts having a frequency of 1 m.c. The timing pulses were, therefore, one microsecond apart. The pulses 36 and 37 were independently controllable to have delays of 1–10,000 microseconds each from the reference pulse 13. The delay multivibrators provided interpolation over a one microsecond range. Pulses having durations from 1.0 microsecond to 10,000 microseconds were obtained with microsecond digital control. The repetition period could be varied from 100 to 10,000 microseconds with digitally controlled repetition rate.

It is apparent that other types of waveform generators may be controlled as described. Thus, rather than a rectangular pulse forming circuit, other types could be employed.

Thus, it is seen that a pulse generator capable of generating pulses at a crystal controlled rate is provided. The pulse width and pulse rate can be digitally controlled simultaneously. A pulse generator suitable for test purposes demanding a high degree of accuracy is provided.

We claim:

1. A pulse generator for generating pulses having controllable duration comprising means for generating first and second pulses which have a time separation which is adjustable in digital increments, a pair of plate coupled blocking oscillators each serving to receive one of said pulses and each forming an output pulse, a bistable circuit connected to said blocking oscillators and adapted to be triggered from one stable condition to another in response to the output pulses, said bistable circuit serving to form an output pulse having a duration corresponding to the time separation of the first and second pulses, amplifying means, and a frequency sensitive coupling network serving to couple said amplifying means to the bistable circuit.

2. A pulse generator as in claim 1 wherein said bistable network comprises a pair of vacuum tubes each having plate, grid and cathode elements, the cathodes of said tubes being coupled to one another, networks connected between the plate and cathode of each of said tubes and forming a load impedance for said tubes, means serving to cross-couple the grids to predetermined points of said networks whereby the signal from the plate of one tube to the grid of the other is attenuated, each of said networks presenting a load impedance and plate-to-grid attenuation which varies with frequency in such a manner that the signal delivered to the amplifying means remains substantially constant over the operating frequency range.

3. A pulse generator as in claim 2 wherein the network is so chosen that the plate-to-grid attenuation at high frequencies is appreciably reduced to apply nearly full plate signal to the grid of the other tube.

4. A pulse generator as in claim 3 in which said networks comprise a pair of serially connected RC circuits having a common terminal connected to said point.

5. A pulse generator as in claim 4 wherein said coupling networks include a shunt peaking inductance.

References Cited in the file of this patent

UNITED STATES PATENTS

| | | |
|---|---|---|
| 2,519,184 | Grosdoff | Aug. 15, 1950 |
| 2,627,033 | Jensen et al. | Jan. 27, 1953 |
| 2,644,887 | Wolfe | July 7, 1953 |
| 2,647,999 | Best | Aug. 4, 1953 |
| 2,669,388 | Fox | Feb. 16, 1954 |
| 2,693,530 | Macdonald | Nov. 2, 1954 |
| 2,693,593 | Crosman | Nov. 2, 1954 |
| 2,713,677 | Scott et al. | July 19, 1955 |
| 2,735,010 | Bedford | Feb. 14, 1956 |
| 2,743,367 | Felsh et al. | Apr. 24, 1956 |
| 2,797,317 | Leeds | June 25, 1957 |
| 2,851,596 | Hilton | Sept. 9, 1958 |
| 2,871,399 | Scuitto | Jan. 27, 1959 |

OTHER REFERENCES

"Recorder and Timer for Short Intervals" (Warren H. Bliss), published in Electronics, Nov. 1947 (pages 126–127) relied on.